(12) United States Patent
Park et al.

(10) Patent No.: US 12,120,883 B2
(45) Date of Patent: Oct. 15, 2024

(54) SEMICONDUCTOR MEMORY DEVICE USING A FERROELECTRIC CHARACTERISTIC OF CHARGE STORAGE LAYER AND OPERATING METHOD THEREOF

(71) Applicant: Samsung Electronics Co., Ltd., Suwon-si (KR)

(72) Inventors: Sang-Yong Park, Suwon-si (KR); Jin-Hong Park, Seoul (KR); Sungjoo Lee, Seongnam-si (KR)

(73) Assignees: SAMSUNG ELECTRONICS CO., LTD., Suwon-si (KR); RESEARCH AND BUSINESS FOUNDATION SUNGKY, Suwon-si (KR)

( * ) Notice: Subject to any disclaimer, the term of this patent is extended or adjusted under 35 U.S.C. 154(b) by 248 days.

(21) Appl. No.: 17/666,448

(22) Filed: Feb. 7, 2022

(65) Prior Publication Data

US 2022/0271057 A1   Aug. 25, 2022

(30) Foreign Application Priority Data

Feb. 25, 2021   (KR) .................. 10-2021-0025467

(51) Int. Cl.
*H10B 51/20* (2023.01)
*H01L 29/51* (2006.01)
*H01L 29/78* (2006.01)
*H10B 51/30* (2023.01)

(52) U.S. Cl.
CPC .......... *H10B 51/20* (2023.02); *H01L 29/516* (2013.01); *H01L 29/78391* (2014.09); *H10B 51/30* (2023.02)

(58) Field of Classification Search
CPC ............. H01L 29/516; H01L 29/78391; H01L 29/792; H10B 51/00; H10B 51/10; H10B 51/20; H10B 51/30
See application file for complete search history.

(56) References Cited

U.S. PATENT DOCUMENTS

| | | | |
|---|---|---|---|
| 6,236,076 B1 | 5/2001 | Arita et al. |
| 6,370,056 B1 | 4/2002 | Chen et al. |
| 6,586,792 B2 | 7/2003 | Ahn et al. |
| 6,587,365 B1 | 7/2003 | Salling |
| 6,858,444 B2 | 2/2005 | Ahn et al. |

(Continued)

FOREIGN PATENT DOCUMENTS

| | | | |
|---|---|---|---|
| JP | 2004071877 A | * | 3/2004 |
| KR | 20080037229 A | | 4/2008 |

(Continued)

*Primary Examiner* — Matthew E Warren
(74) *Attorney, Agent, or Firm* — Muir Patent Law, PLLC

(57) ABSTRACT

A semiconductor memory device capable of improving performance by the use of a charge storage layer including a ferroelectric material is provided. The semiconductor memory device includes a substrate, a tunnel insulating layer contacting the substrate, on the substrate, a charge storage layer contacting the tunnel insulating layer and including a ferroelectric material, on the tunnel insulating layer, a barrier insulating layer contacting the charge storage layer, on the charge storage layer, and a gate electrode contacting the barrier insulating layer, on the barrier insulating layer.

10 Claims, 21 Drawing Sheets

(56) References Cited

U.S. PATENT DOCUMENTS

| | | |
|---|---|---|
| 6,876,022 B2 | 4/2005 | Salling et al. |
| 6,888,185 B2 | 5/2005 | Salling et al. |
| 6,903,960 B2 | 6/2005 | Salling et al. |
| 6,914,800 B2 | 7/2005 | Ahn et al. |
| 7,052,941 B2 | 5/2006 | Lee |
| 8,223,548 B2 | 7/2012 | Hayashi et al. |
| 10,032,788 B2* | 7/2018 | Hattori ................. H10K 85/381 |
| 10,210,921 B1 | 2/2019 | Hwang |
| 10,734,408 B2 | 8/2020 | Dong et al. |
| 2006/0157754 A1* | 7/2006 | Jeon ..................... H01L 29/792 |
| | | 438/257 |
| 2010/0314679 A1* | 12/2010 | Lee ...................... H01L 29/513 |
| | | 257/324 |
| 2020/0203499 A1 | 6/2020 | Chang et al. |
| 2020/0279927 A1 | 9/2020 | Sakai et al. |
| 2023/0320100 A1* | 10/2023 | Yamazaki .............. H10B 53/20 |
| | | 257/295 |

FOREIGN PATENT DOCUMENTS

| | | | |
|---|---|---|---|
| KR | 20110092034 A | 8/2011 | |
| WO | WO-2010131824 A1 * | 11/2010 | ......... G11C 11/5678 |

* cited by examiner

SEMICONDUCTOR MEMORY DEVICE USING A FERROELECTRIC CHARACTERISTIC OF CHARGE STORAGE LAYER AND OPERATING METHOD THEREOF

CROSS-REFERENCE TO RELATED APPLICATION

This application claims priority under 35 U.S.C. § 119 to Korean Patent Application No. 10-2021-0025467 filed on Feb. 25, 2021 in the Korean Intellectual Property Office, the disclosure of which is incorporated by reference herein in its entirety.

BACKGROUND

1. Technical Field of the Disclosure

The present disclosure relates to a semiconductor memory device.

2. Description of the Related Art

A non-volatile memory refers to a memory in which stored information is not erased even when an external power supply is shut off. As the non-volatile memory, there are a NOR type non-volatile memory (NOR type flash memory) which enables a high-speed random access, and a NAND type non-volatile memory (NAND type flash memory) which has excellent programming and erasing speeds and enables high integration, depending on a structure of a cell array.

In general, a cell transistor of the non-volatile memory has a structure in which a charge storage layer is further included in a general MOS (Metal Oxide Semiconductor) transistor. In the cell transistor of the non-volatile memory, a charge storage layer is located on a semiconductor substrate via a tunnel oxide film, and a control gate is formed above the charge storage layer via a gate interlayer dielectric film.

Because a non-volatile memory element applies a high voltage to program and erase operations and takes advantage of hot carrier or tunneling characteristics that occur in the channel, there is a need for a lot of time to store data. Accordingly, the operating speed is slower than that of other memory elements, and an element that operates at a high voltage is required. Therefore, it is necessary to configure elements that operate at various voltages in a single chip. In addition, since the non-volatile memory element is driven at a high voltage, a lot of power is consumed, and there is a problem of a limit in applying information storage and chip operation to elements that use a low voltage and a low power or use a high-speed operation.

SUMMARY

Aspects of the present disclosure provide a semiconductor memory device capable of improving performance by the use of a charge storage layer including a ferroelectric material.

According to an aspect of the present disclosure, there is provided a semiconductor memory device. The semiconductor memory device includes a substrate, a tunnel insulating layer contacting the substrate, a charge storage layer contacting the tunnel insulating layer and including a ferroelectric material, a barrier insulating layer contacting the charge storage layer, and a gate electrode contacting the barrier insulating layer. The tunnel insulating layer, the charge storage layer, the barrier insulating layer, and the gate electrode are sequentially stacked on the substrate.

According to another aspect of the present disclosure, there is provided a semiconductor memory device. The semiconductor memory device includes a substrate, a stacked structure having a plurality of insulating layers and a plurality of gate layers alternately stacked on the substrate, a channel hole which penetrates the stacked structure, and a channel structure inside the channel hole. The channel structure includes a barrier insulating layer, a charge storage layer, a tunnel insulating layer, and a channel pattern sequentially formed along a profile of the channel hole. The barrier insulating layer contacts the gate layer, the charge storage layer is placed on the barrier insulating layer, contacts the barrier insulating layer, and includes a ferroelectric material, the tunnel insulating layer is placed on the charge storage layer contacts the charge storage layer, and the channel pattern is placed on the tunnel insulating layer, and contacts the tunnel insulating layer.

According to another aspect of the present disclosure, there is provided a semiconductor memory device. The semiconductor memory device includes a substrate, a tunnel insulating layer contacting the substrate, a charge storage layer contacting the tunnel insulating layer and including a ferroelectric material, a barrier insulating layer contacting an upper surface and side walls of the charge storage layer, and a part of un upper surface of the tunnel insulating layer, a gate electrode contacting the barrier insulating layer. The tunnel insulating layer, the charge storage layer, the barrier insulating layer, and the gate electrode are sequentially stacked on the substrate.

However, aspects of the present disclosure are not restricted to the one set forth herein. The other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof referring to the attached drawings, in which.

DETAILED DESCRIPTION OF THE EMBODIMENTS

Figure 1:
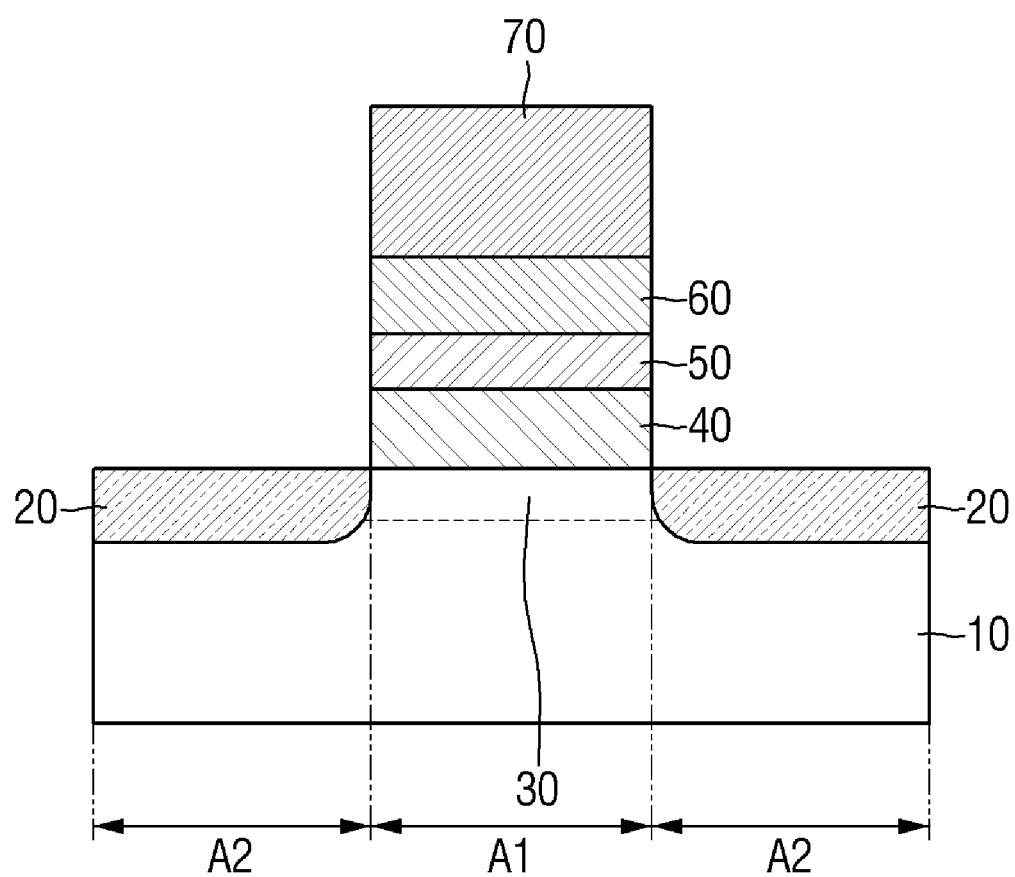
FIG. 1 is a diagram for explaining a semiconductor memory device according to some example embodiments.

Hereinafter, embodiments of the present disclosure will be described in detail referring to the accompanying drawings. The same components on the drawings are denoted by the same reference numerals, and repeated description thereof will not be provided.

FIG. 1 is a diagram for explaining a semiconductor memory device according to some example embodiments.

Semiconductor memory devices may be classified as volatile memory devices, in which stored data disappear when a power is turned off, such as a static random access memory (SRAM) or a dynamic random access memory (DRAM), or nonvolatile memory devices, in which stored data are retained even when a power is turned off, such as a flash memory, a phase-change RAM (PRAM), a magnetic RAM (MRAM), a resistive RAM (RRAM), or a ferroelectric RAM (FRAM).

Referring to FIG. 1, the semiconductor memory device according to some example embodiments may include a first substrate 10, source/drain region 20, a channel region 30, a first tunnel insulating layer 40, a first charge storage layer 50, a first barrier insulating layer 60, and a gate electrode 70. The first substrate 10, the source/drain region 20, the channel region 30, the first tunnel insulating layer 40, the first charge storage layer 50, the first barrier insulating layer 60, and the gate electrode 70 may constitute a memory cell of the semiconductor memory device. Thicknesses of each of the first substrate 10, the first tunnel insulating layer 40, the first charge storage layer 50, the first barrier insulating layer 60, and the gate electrode 70 are only shown as an example, and the technical idea of the present disclosure is not limited thereto.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The first substrate 10 may be bulk silicon or SOI (silicon-on-insulator). In contrast, the first substrate 10 may be a silicon substrate or may include or be formed of, but is not limited to, other materials, for example, silicon, germanium, SGOI (silicon germanium on insulator), indium antimonide, lead tellurium compounds, indium arsenic, indium phosphide, gallium arsenide or gallium antimonide.

The source/drain region 20 and the channel region 30 may be formed on the first substrate 10.

Impurity ions may be doped to form the source/drain region 20. Although the source/drain region 20 is shown as an impurity region formed in the first substrate 10, the embodiment is not limited thereto. The source/drain region 20 may include an epitaxial layer formed on or inside the first substrate 10. The channel region 30 may be formed between the source/drain regions 20.

The first tunnel insulating layer 40 may be placed on the first substrate 10. The first tunnel insulating layer 40 may be in contact with the first substrate 10. The first tunnel insulating layer 40 may be placed on the channel region 30.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The first tunnel insulating layer 40 may include or be formed of, for example, silicon oxide, oxynitride such as silicon oxynitride, silicon oxide doped with impurities, and the like. In some examples, the first tunnel insulating layer 40 may include or be formed of a metal oxide having a high dielectric constant such as hafnium oxide, titanium oxide, tantalum oxide, zirconium oxide, aluminum oxide, lanthanum oxide, or strontium titanium oxide.

The first charge storage layer 50 may be a charge trap type membrane or a floating gate. A method of trapping the charge is merely an example, and the technical idea of the present disclosure is not limited thereto.

The first charge storage layer 50 may be placed on the first tunnel insulating layer 40. The first charge storage layer 50 may be in contact with the first tunnel insulating layer 40.

The first charge storage layer 50 may include or be formed of a ferroelectric material. Although the first charge storage layer 50 may include or be formed of at least one of InSe and BaTiO$_3$, this is merely an example, and the technical idea of the present disclosure is not limited thereto.

The first barrier insulating layer 60 may be placed on the first charge storage layer 50. The first barrier insulating layer 60 may be in contact with the first charge storage layer 50.

The first barrier insulating layer 60 may include or be formed of a material having a higher dielectric constant than the first tunnel insulating layer 40. For example, the first barrier insulating layer 60 may include or be formed of a metal oxide having a high dielectric constant such as hafnium oxide, titanium oxide, tantalum oxide, zirconium oxide, aluminum oxide, lanthanum oxide, and strontium titanium oxide. In some examples, the first barrier insulating layer 60 may include or be formed of silicon oxide, silicon oxide doped with impurities, or oxynitride such as silicon oxynitride.

The gate electrode 70 may be placed on the first barrier insulating layer 60. The gate electrode 70 may be in contact with the first barrier insulating layer 60.

The first tunnel insulating layer 40 may extend along a lower surface of the first charge storage layer 50. The first tunnel insulating layer 40 may not be in contact with the first barrier insulating layer 60.

Figure 12:
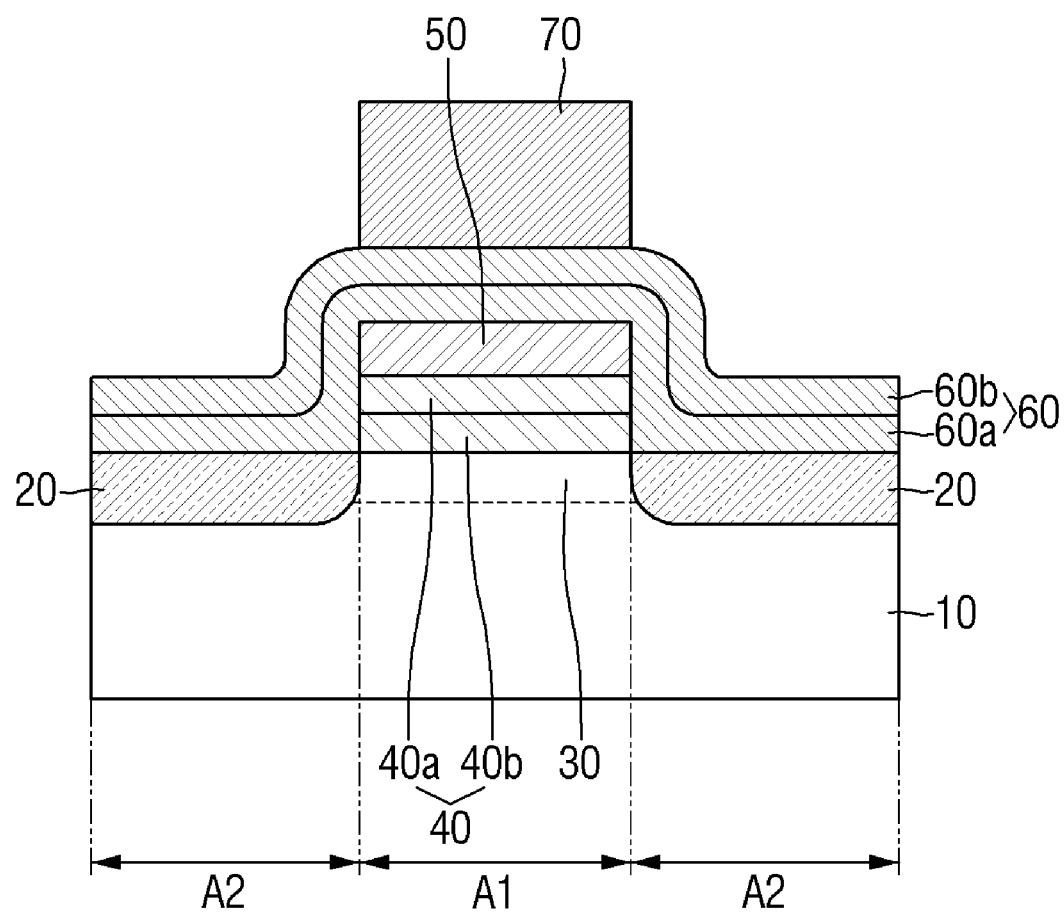
Figure 13:
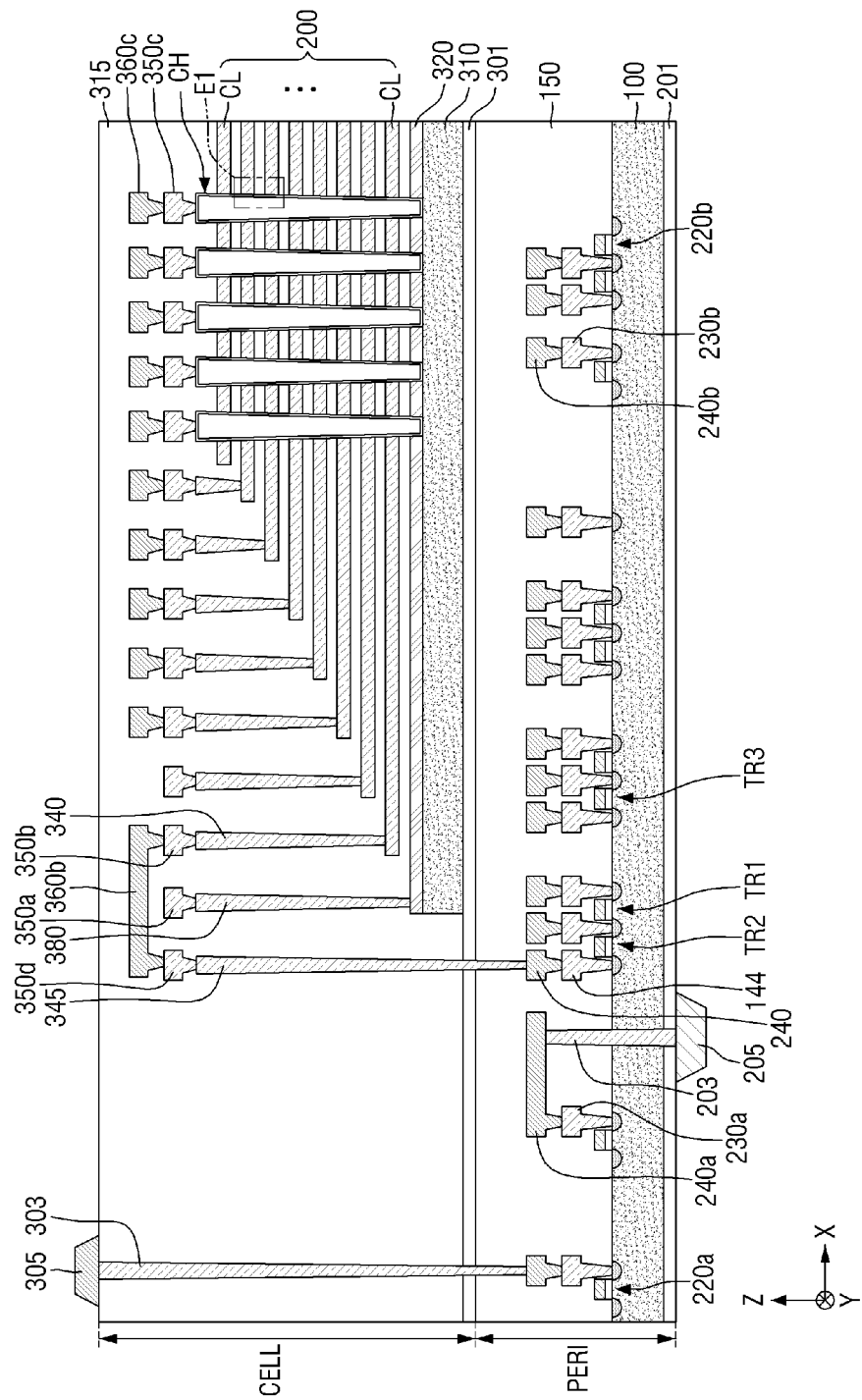
FIG. 13 is a cross-sectional view for explaining a semiconductor memory device according to some example embodiments.

Terms of orientation herein, such as "lower," "upper," "above," and "below" mean relative to a first substrate 10 (FIGS. 1-12), a second substrate 100 (FIG. 13) or a third substrate 310 (FIG. 13). For example, if a first element is "above" a second element, it means that the first element is farther from the substrate 10, and if a third element is "below" a fourth element, it means that the third element is closer to the substrate 10.

The first barrier insulating layer 60 may extend along the upper surface of the first charge storage layer 50. The first barrier insulating layer 60 may not be formed along the side surfaces of the first charge storage layer 50.

Specifically, the semiconductor memory device according to some example embodiments may include a first region A1 and a second region A2. The first tunnel insulating layer 40, the first charge storage layer 50, the first barrier insulating layer 60, and the gate electrode 70 may be placed on the first region A1, and may not be placed on the second region A2.

Although not shown in the drawing, a spacer film may be placed on both side walls of the first tunnel insulating layer 40, the first charge storage layer 50, the first barrier insulating layer 60, and the gate electrode 70. The technical idea of the present disclosure is not limited thereto.

Figure 2:
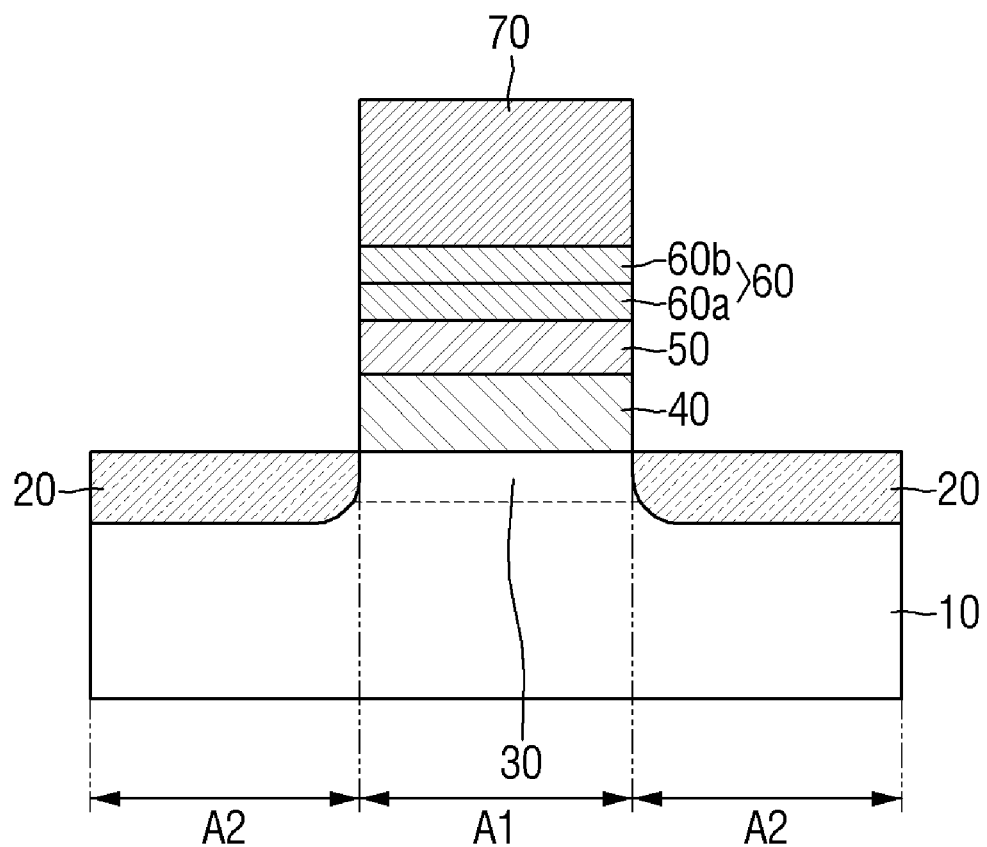
FIGS. 2 to 4 are diagrams for explaining a semiconductor memory device according to some example embodiments, respectively.
Figure 3:
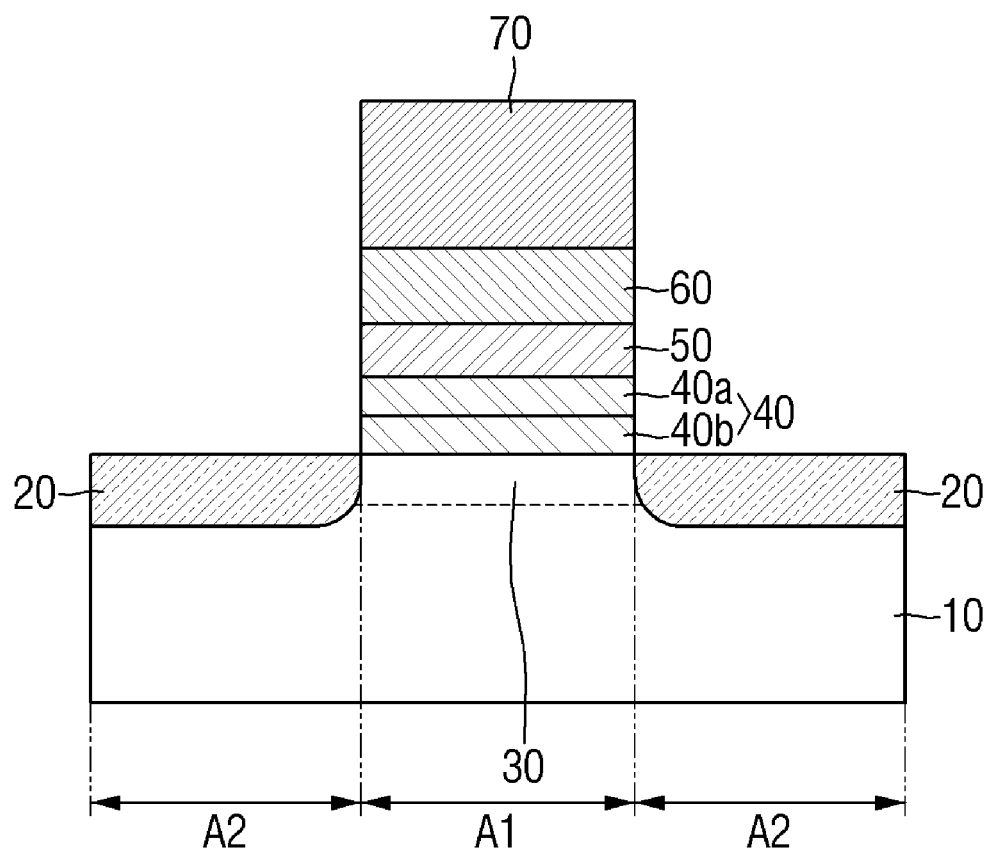
Figure 4:
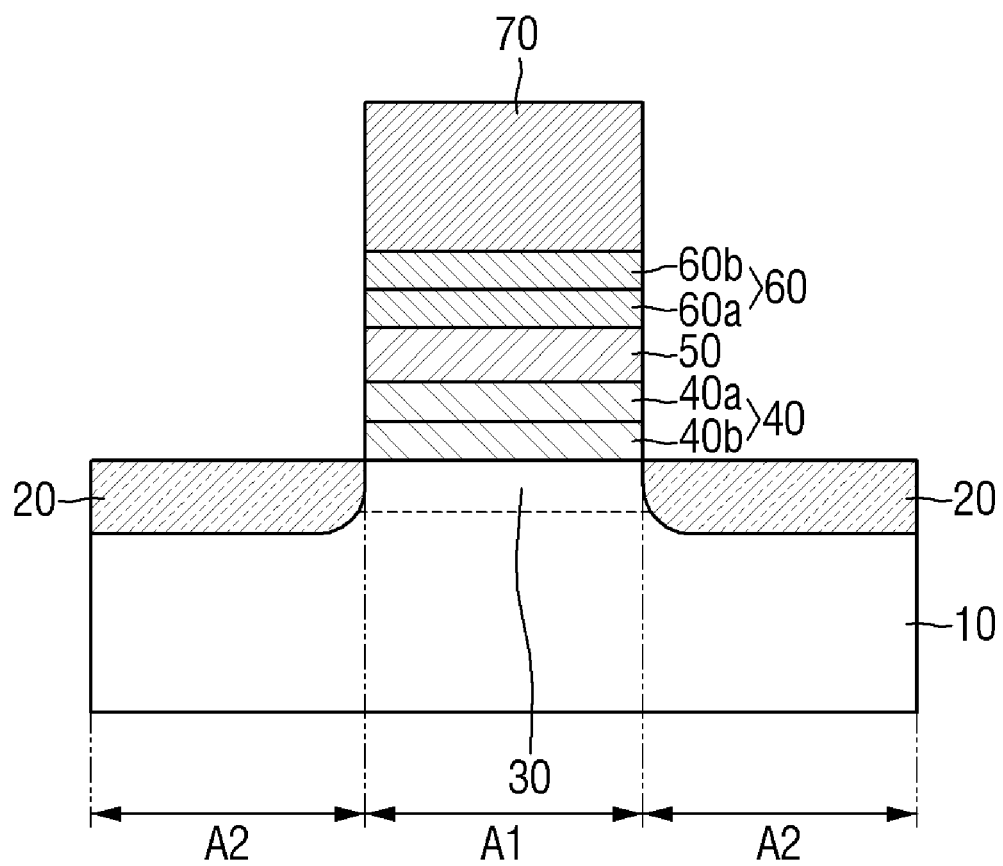

FIGS. 2 to 4 are diagrams for explaining a semiconductor memory device according to some example embodiments, respectively. Differences from those described using FIG. 1 will be mainly described Referring to FIG. 2, in the semiconductor memory device according to some example embodiments, the first barrier insulating layer 60 may be made of a composite film. Specifically, the first barrier insulating layer 60 may include a first_first barrier insulating layer 60*a* and a first second barrier insulating layer 60*b*.

In some example embodiments, a material of the first_first barrier insulating layer 60*a* may be different from a material of the first second barrier insulating layer 60*b*. In some examples, the first_first barrier insulating layer 60*a* may include silicon oxide and the first second barrier insulating layer 60*b* may include silicon oxynitride, hafnium oxide, titanium oxide, tantalum oxide, zirconium oxide, aluminum oxide, lanthanum oxide, or strontium titanium oxide, and vice versa.

The first_first barrier insulating layer 60*a* may extend along the upper surface of the first charge storage layer 50. The first_first barrier insulating layer 60*a* may be in contact with the first charge storage layer 50.

The first second barrier insulating layer 60*b* may extend along the upper surface of the first_first barrier insulating layer 60*a*. The first second barrier insulating layer 60*b* may be in contact with the first_first barrier insulating layer 60*a*.

Referring to FIG. 3, in the semiconductor memory device according to some example embodiments, the first tunnel insulating layer 40 may be made of a composite film. Specifically, the first tunnel insulating layer 40 may include a first_first tunnel insulating layer 40*a* and a first second tunnel insulating layer 40*b*.

In some example embodiments, a material of the first_first tunnel insulating layer 40*a* may be different from a material of the first second tunnel insulating layer 40*b*. In some examples, the first_first tunnel insulating layer 40*a* may include or be formed of silicon oxide and the first second tunnel insulating layer 40*b* may include or be formed of silicon oxynitride, hafnium oxide, titanium oxide, tantalum oxide, zirconium oxide, aluminum oxide, lanthanum oxide, or strontium titanium oxide, and vice versa.

The first_first tunnel insulating layer 40*a* may extend along the lower surface of the first charge storage layer 50. The first_first tunnel insulating layer 40*a* may be in contact with the first charge storage layer 50.

The first second tunnel insulating layer 40*b* may extend along the lower surface of the first_first tunnel insulating layer 40*a*. The first second tunnel insulating layer 40*b* may be in contact with the first_first tunnel insulating layer 40*a*.

Referring to FIG. 4, in the semiconductor memory device according to some example embodiments, each of the first barrier insulating layer 60 and the first tunnel insulating layer 40 may be made of a composite film. Specifically, the first barrier insulating layer 60 may include the first_first barrier insulating layer 60*a* and the first second barrier insulating layer 60*b*, and the first tunnel insulating layer 40 may include the first_first tunnel insulating layer 40*a* and the first second tunnel insulating layer 40*b*.

As shown in FIG. 4, the placement of the first barrier insulating layer 60 and the first tunnel insulating layer 40 may be the same as the placement of the first barrier insulating layer 60 and the first tunnel insulating layer 40 each described in FIGS. 2 and 3.

Figure 5:
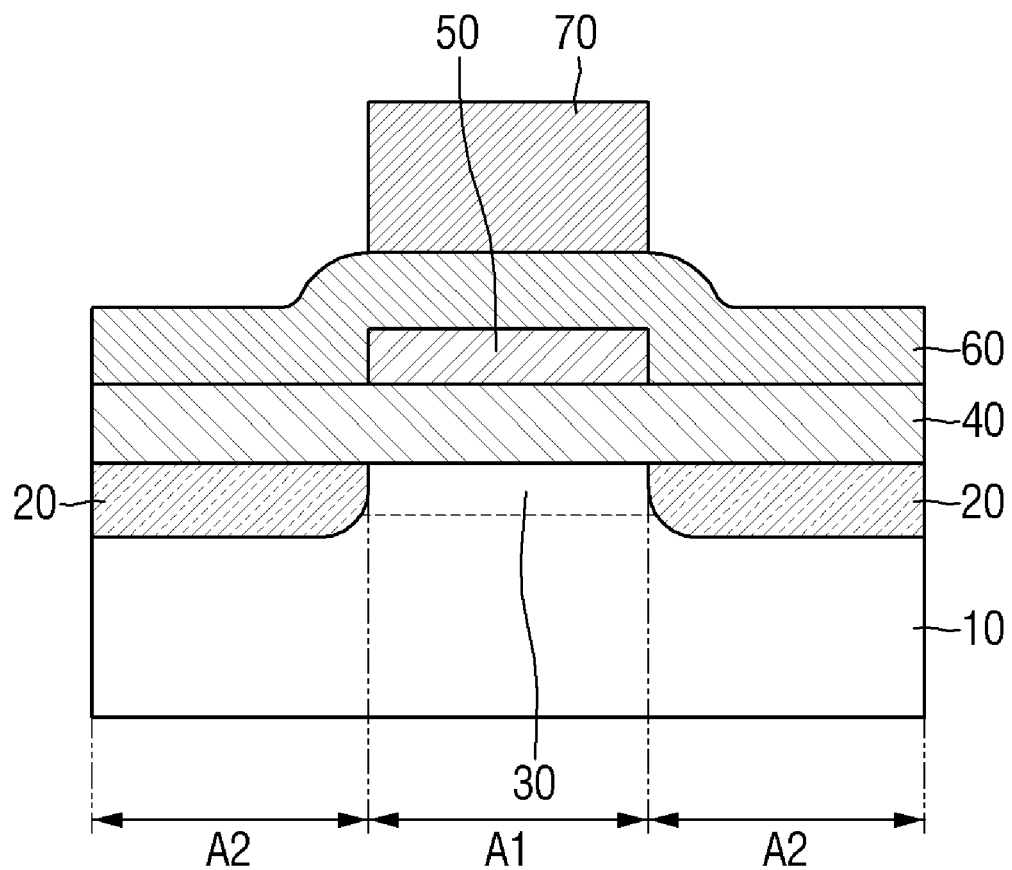
FIG. 5 is a diagram for explaining a semiconductor memory device according to some example embodiments.

FIG. 5 is a diagram for explaining a semiconductor memory device according to some example embodiments. Differences from those described using FIG. 1 will be mainly described.

Referring to FIG. 5, in the semiconductor memory device according to some example embodiments, the first charge storage layer 50 and the gate electrode 70 may be placed on the first region A1, may not be placed on the second region A2. The first tunnel insulating layer 40 and the first barrier insulating layer 60 may be placed on the first region A1 and the second region A2.

The first tunnel insulating layer 40 may extend in one direction. The first tunnel insulating layer 40 may extend along a lower surface of the first charge storage layer 50 and a part of a lower surface of the first barrier insulating layer 60. The first tunnel insulating layer 40 may cover at least a part of a source/drain region 20.

On the first region A1, the first tunnel insulating layer 40 may extend along the lower surface of the first charge storage layer 50. On the first region A1, the first tunnel insulating layer 40 may be in contact with the lower surface of the first charge storage layer 50.

On the second region A2, the first tunnel insulating layer 40 may extend along the lower surface of the first barrier insulating layer 60. On the second region A2, the first tunnel insulating layer 40 may be in contact with the lower surface of the first barrier insulating layer 60.

The first barrier insulating layer 60 may extend along the upper surface and the side surfaces of the first charge storage layer 50.

Specifically, on the first region A1, the first barrier insulating layer 60 may extend along the upper surface of the first charge storage layer 50. On the first region A1, the first barrier insulating layer 60 may be in contact with the upper surface of the first charge storage layer 50.

On the second region A2, the first barrier insulating layer 60 may extend along the side surfaces of the first charge storage layer 50 and the upper surface of the first tunnel insulating layer 40. The first barrier insulating layer 60 may be in contact with the side surfaces of the first charge storage layer 50 and the upper surface of the first tunnel insulating layer 40.

Figure 6:
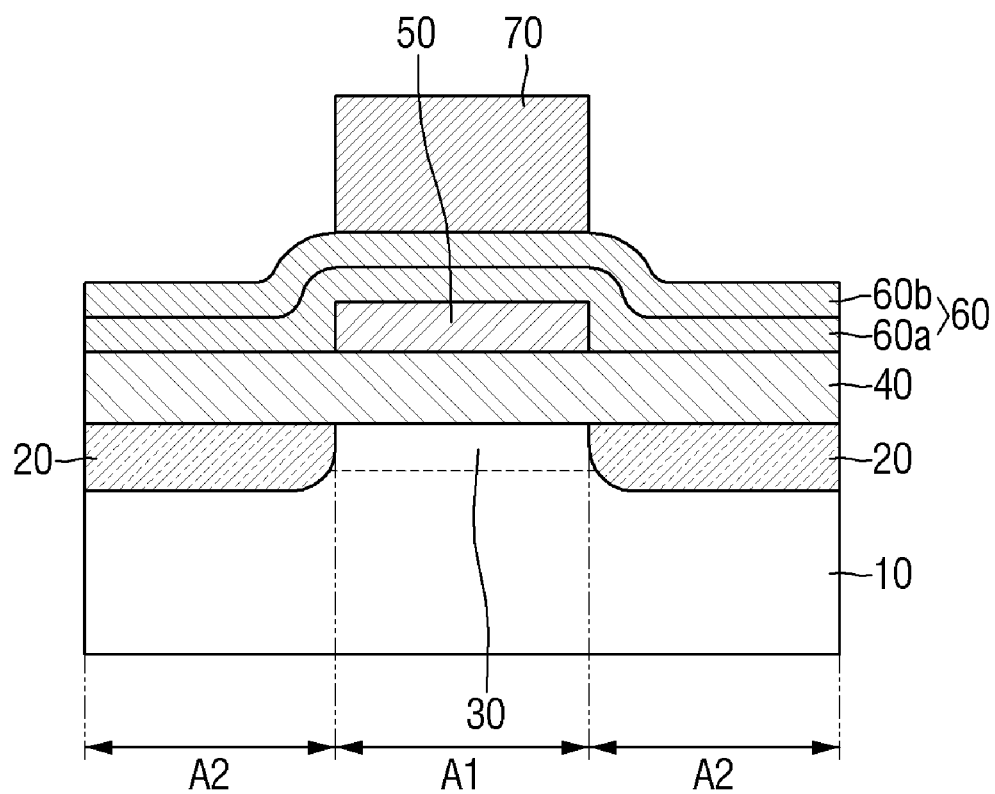
FIGS. 6 to 8 are diagrams for explaining a semiconductor memory device according to some example embodiments.
Figure 7:
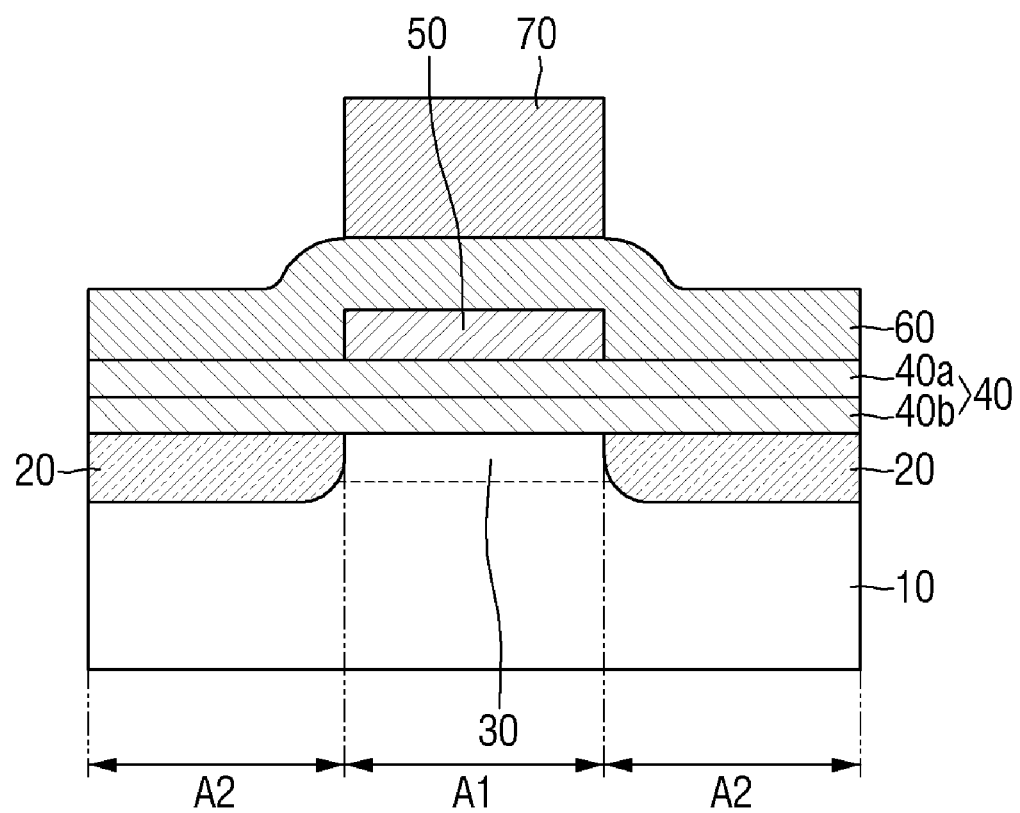
Figure 8:
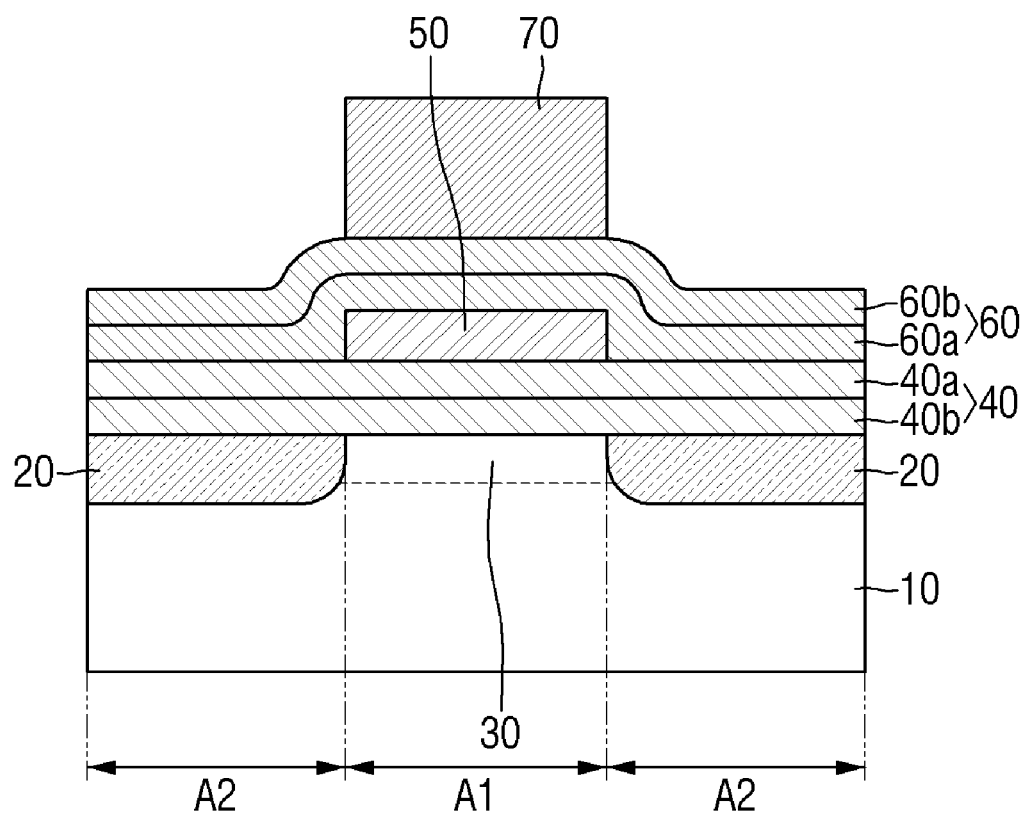

FIGS. 6 to 8 are diagrams for explaining a semiconductor memory device according to some example embodiments. Differences from those described using FIG. 5 will be mainly described.

Referring to FIG. 6, in the semiconductor memory device according to some example embodiments, the first barrier insulating layer 60 may be made of a composite film. Specifically, the first barrier insulating layer 60 may include the first_first barrier insulating layer 60*a* and the first second barrier insulating layer 60*b*.

The first_first barrier insulating layer 60*a* may extend along the upper surface and side surfaces of the first charge storage layer 50 and a part of the upper surface of the first tunnel insulating layer 40. The first_first barrier insulating layer 60a may be in contact with the upper surface and side surfaces of the first charge storage layer 50 and a part of the upper surface of the first tunnel insulating layer 40.

The first second barrier insulating layer 60b may extend along the upper surface of the first_first barrier insulating layer 60a. The first second barrier insulating layer 60b may be in contact with the first_first barrier insulating layer 60a.

Referring to FIG. 7, in the semiconductor memory device according to some example embodiments, the first tunnel insulating layer 40 may be made of a composite film. Specifically, the first tunnel insulating layer 40 may include the first_first tunnel insulating layer 40a and the first second tunnel insulating layer 40b.

The first_first tunnel insulating layer 40a may extend along the lower surface of the first charge storage layer 50 and a part of the lower surface of the first barrier insulating layer 60. The first_first tunnel insulating layer 40a may be in contact with the lower surface of the first charge storage layer 50 and a part of the lower surface of the first barrier insulating layer 60.

The first second tunnel insulating layer 40b may extend along the lower surface of the first_first tunnel insulating layer 40a. The first second tunnel insulating layer 40b may be in contact with the first_first tunnel insulating layer 40a. The first second tunnel insulating layer 40b may cover at least a part of the source/drain region 20.

Referring to FIG. 8, in the semiconductor memory device according to some example embodiments, each of the first barrier insulating layer 60 and the first tunnel insulating layer 40 may be made of a composite film. Specifically, the first barrier insulating layer 60 may include the first_first barrier insulating layer 60a and the first second barrier insulating layer 60b, and the first tunnel insulating layer 40 may include the first_first tunnel insulating layer 40a and the first second tunnel insulating layer 40b.

As shown in FIG. 8, the placement of the first barrier insulating layer 60 and the first tunnel insulating layer 40 may be the same as the placement of the first barrier insulating layer 60 and the first tunnel insulating layer 40 each described in FIGS. 6 and 7.

Figure 9:
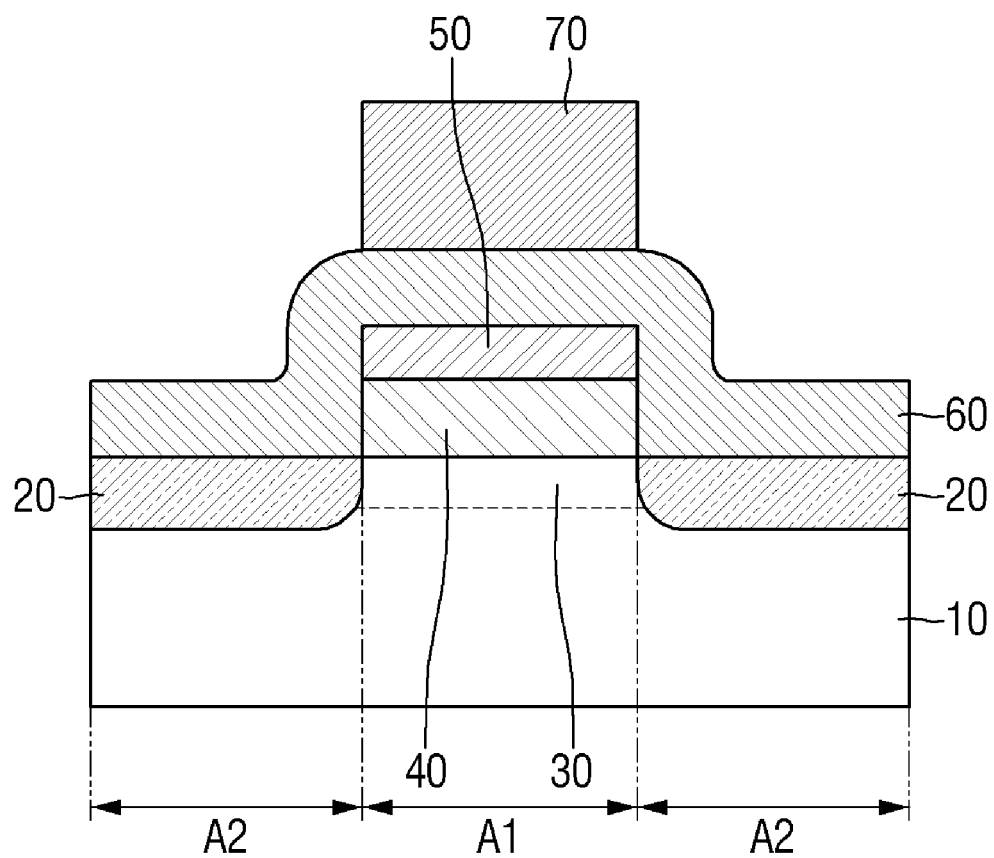
FIG. 9 is a diagram for explaining a semiconductor memory device according to some example embodiments.

FIG. 9 is a diagram for explaining a semiconductor memory device according to some example embodiments. Differences from those described using FIG. 1 will be mainly described.

Referring to FIG. 9, in the semiconductor memory device according to some example embodiments, the first tunnel insulating layer 40, the first charge storage layer 50, and the gate electrode 70 may be placed on the first region A1, and may not be placed on the second region A2. The first barrier insulating layer 60 may be placed on the first region A1 and the second region A2.

The first barrier insulating layer 60 may extend along the upper surface and side surfaces of the first charge storage layer 50 and the side surfaces of the first tunnel insulating layer 40. The first barrier insulating layer 60 may cover at least a part of the source/drain region 20.

Specifically, on the first region A1, the first barrier insulating layer 60 may extend along the upper surface of the first charge storage layer 50. On the first region A1, the first barrier insulating layer 60 may be in contact with the upper surface of the first charge storage layer 50.

On the second region A2, the first barrier insulating layer 60 may extend along the side surfaces of the first charge storage layer 50, the side surfaces of the first tunnel insulating layer 40, and the upper surface of the source/drain region 20. The first barrier insulating layer 60 may be in contact with the side surfaces of the first charge storage layer 50, the side surfaces of the first tunnel insulating layer 40, and the upper surface of the source/drain region 20.

Figure 10:
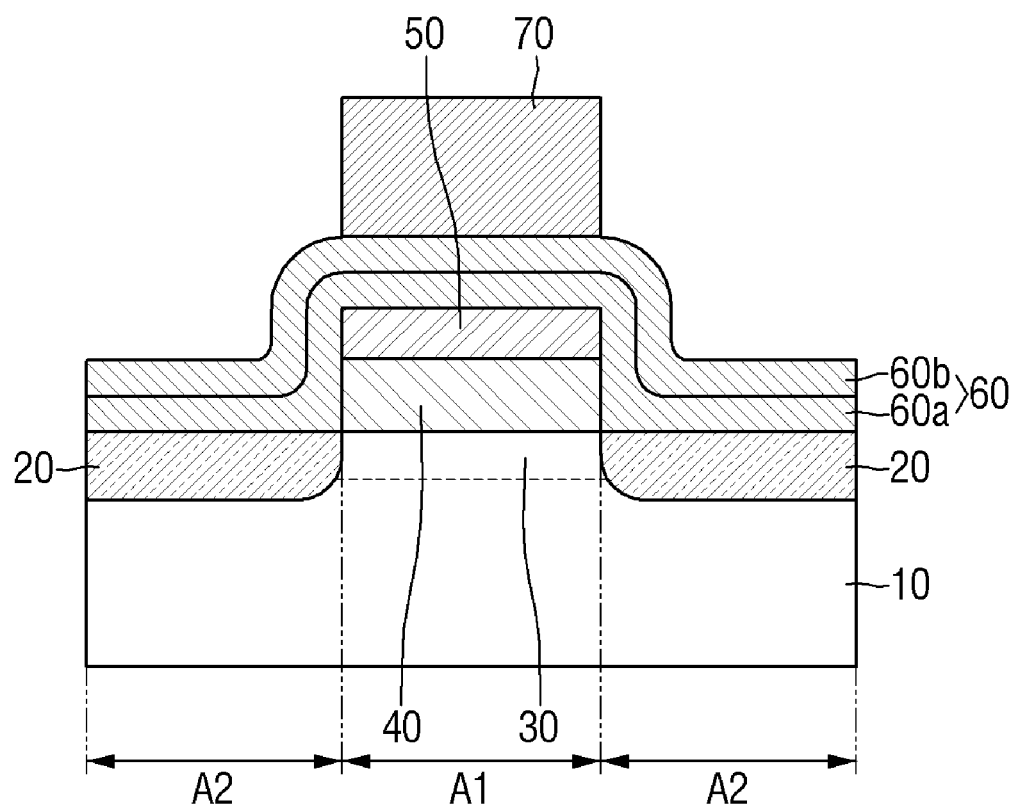
FIGS. 10 to 12 are diagrams for explaining a semiconductor memory device according to some example embodiments, respectively.
Figure 11:
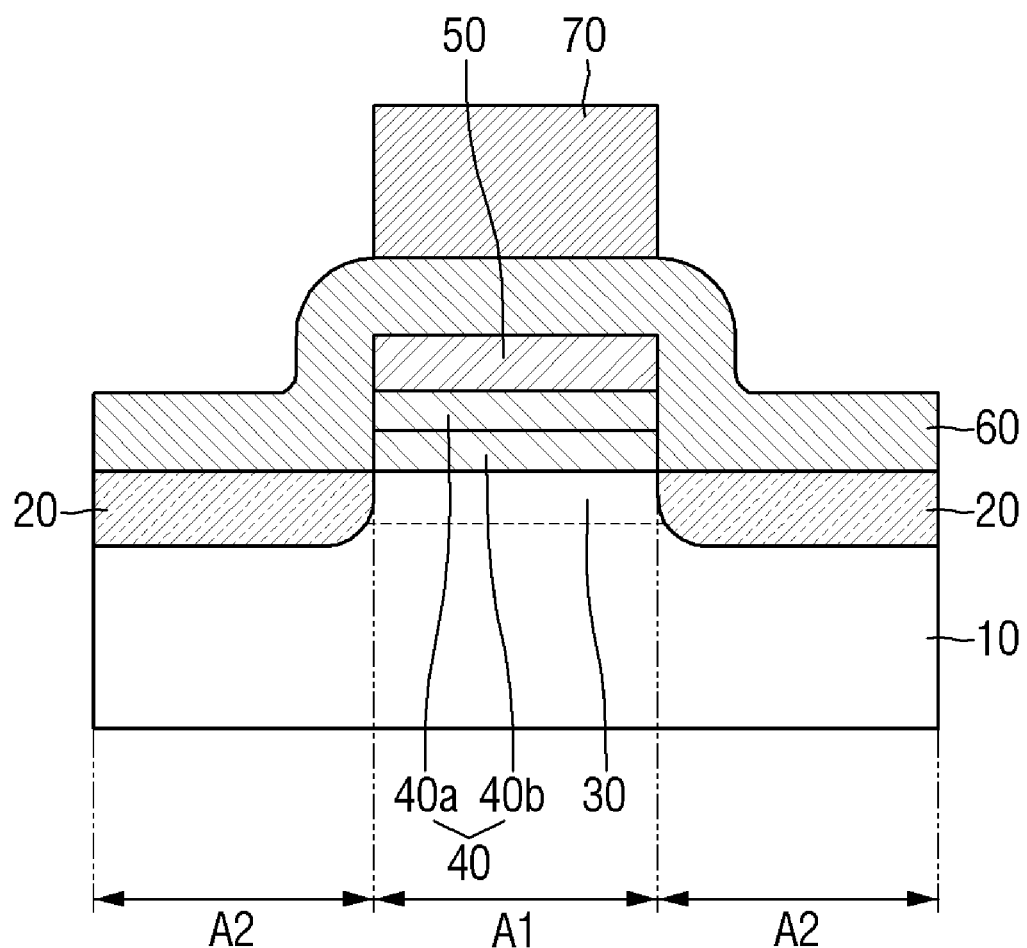

FIGS. 10 to 12 are diagrams for explaining a semiconductor memory device according to some example embodiments, respectively. Differences from those described using FIG. 9 will be mainly described.

Referring to FIG. 10, in the semiconductor memory device according to some example embodiments, the first barrier insulating layer 60 may be made of a composite film. Specifically, the first barrier insulating layer 60 may include the first_first barrier insulating layer 60a and the first second barrier insulating layer 60b.

The first_first barrier insulating layer 60a may extend along the upper surface and side surfaces of the first charge storage layer 50, the side surfaces of the first tunnel insulating layer 40, and the upper surface of the source/drain region 20. The first_first barrier insulating layer 60a may be in contact with the upper surface and side surfaces of the first charge storage layer 50, the side surfaces of the first tunnel insulating layer 40, and the upper surface of the source/drain region 20. The first_first barrier insulating layer 60a may cover at least a part of the source/drain region 20.

The first second barrier insulating layer 60b may extend along the upper surface of the first_first barrier insulating layer 60a. The first second barrier insulating layer 60b may be in contact with the first_first barrier insulating layer 60a.

Referring to FIG. 11, in the semiconductor memory device according to some example embodiments, the first tunnel insulating layer 40 may be made of a composite film. Specifically, the first tunnel insulating layer 40 may include the first_first tunnel insulating layer 40a and the first second tunnel insulating layer 40b.

The first_first tunnel insulating layer 40a may extend along the lower surface of the first charge storage layer 50. The first_first tunnel insulating layer 40a may be in contact with the lower surface of the first charge storage layer 50.

The first second tunnel insulating layer 40b may extend along the lower surface of the first_first tunnel insulating layer 40a. The first second tunnel insulating layer 40b may be in contact with the first_first tunnel insulating layer 40a.

Referring to FIG. 12, in the semiconductor memory device according to some example embodiments, both the first barrier insulating layer 60 and the first tunnel insulating layer 40 may be made of a composite film. Specifically, the first barrier insulating layer 60 may include the first_first barrier insulating layer 60a and the first second barrier insulating layer 60b, and the first tunnel insulating layer 40 may include the first_first tunnel insulating layer 40a and the first second tunnel insulating layer 40b.

As shown in FIG. 12, the placement of the first barrier insulating layer 60 and the first tunnel insulating layer 40 may be the same as the placement of the first barrier insulating layer 60 and the first tunnel insulating layer 40 each described in FIGS. 10 and 11.

FIG. 13 is a cross-sectional view for explaining a semiconductor memory device according to some example embodiments.

Referring to FIG. 13, the semiconductor memory device according to some example embodiments may include a peripheral circuit region PERI and a cell region CELL.

The peripheral circuit region PERI may include a second substrate 100, an interlayer insulating film 150, a plurality of circuit elements TR1, TR2, TR3, 220a and 220b formed on the second substrate 100, first metal layers 144, 230a and 230b connected to each of the plurality of circuit elements TR1, TR2, TR3, 220a and 220b, and second metal layers 240, 240a and 240b formed on the first metal layers 144, 230a and 230b.

In some example embodiments, first to third circuit elements TR1, TR2 and TR3 may provide a decoder circuit (e.g., a row decoder and a column decoder) in the peripheral circuit region PERI. In some example embodiments, a fourth circuit element 220a may provide a logic circuit in the peripheral circuit region PERI. In some example embodiments, a fifth circuit element 220b may provide a page buffer in the peripheral circuit region PERI.

In the present disclosure, although only the first metal layers 144, 230a and 230b and the second metal layers 240, 240a and 204b are shown and described, the present disclosure is not limited thereto, and at least one or more metal layers may be further formed on the second metal layers 240, 240a and 240b. At least a part of one or more metal layers formed above the second metal layers 240, 240a and 240b may be formed of aluminum or the like that has a lower resistance than copper that forms the second metal layers 240, 240a and 240b.

In some example embodiments, the first metal layers 144, 230a and 230b may be made of tungsten, which has a relatively high resistance, and the second metal layers 240, 240a and 240b may be made of copper which has a relatively low resistance.

The interlayer insulating film 150 may be placed on the second substrate 100 to cover the plurality of circuit elements TR1, TR2, TR3, 220a and 220b, the first metal layers 144, 230a and 230b, and the second metal layers 240, 240a and 240b.

The cell region CELL may provide at least one memory block. The cell region CELL may include a third substrate 310 and a conductive line 320. The third substrate 310 may correspond to the first substrate 10 of each of FIGS. 1-12. A plurality of word lines may be stacked on the third substrate 310 along a vertical direction Z that intersects the upper surface of the third substrate 310.

The plurality of word lines may correspond to a gate layer CL. A string selection line and a ground selection line may each be placed above and below the word lines, and a plurality of word lines may be placed between the string selection line and the ground selection line.

A plurality of insulating layers IL and a plurality of gate layers CL may be alternately stacked to form a stacked structure 200.

A channel structure CH may extend in the vertical direction Z to penetrate the word lines, the string selection lines and the ground selection lines. The channel structure CH may be formed as a single stack, as shown in FIG. 13. However, this is only an example, and the technical idea of the present disclosure is not limited thereto. For example, the channel structure CH may be formed as a multi-stack.

The channel structure CH may be electrically connected to a first metal layer 350c and a second metal layer 360c. For example, the first metal layer 350c may be a bit line contact, and the second metal layer 360c may be a bit line. In some example embodiments, the bit line 360c may extend along one direction (e.g., a first horizontal direction Y) parallel to the upper surface of the third substrate 310. In some example embodiments, the bit line 360c may be electrically connected to the fifth circuit element 220b that provides the page buffer in the peripheral circuit region PERI.

Figure 14:
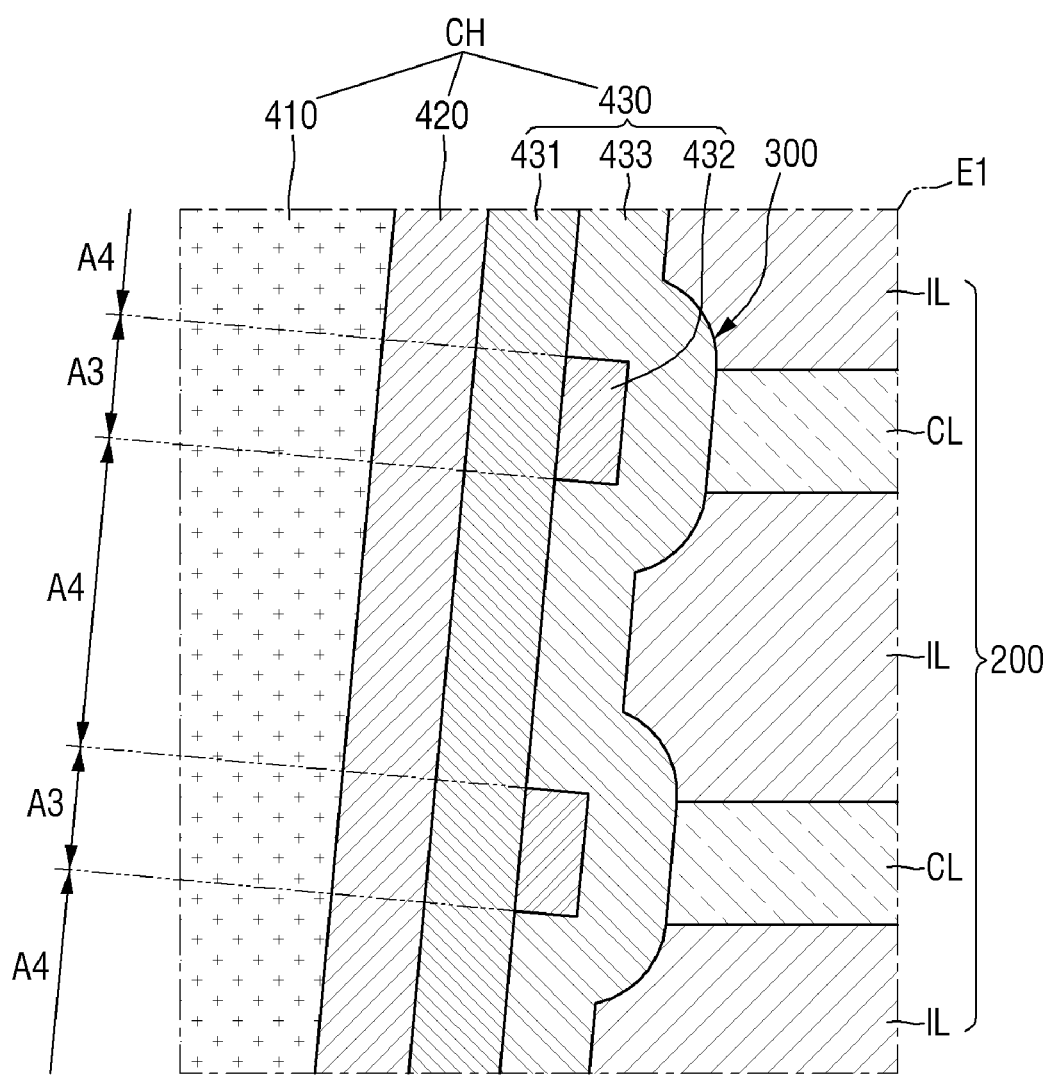
FIG. 14 is an enlarged view of a region μl of FIG. 13.

FIG. 14 is an enlarged view of a region μl of FIG. 13. Repeated description of the above-described embodiment will be simplified or omitted.

The semiconductor memory device according to some example embodiments may include a stacked structure 200, a channel hole 300, and a channel structure CH.

The stacked structure 200 may include a plurality of insulating layers IL and a plurality of gate layers CL that are alternately stacked. The channel hole 300 may penetrate the stacked structure 200. At least one of the plurality of gate layers CL may correspond to one of the gate electrodes 70 of FIGS. 1 to 12.

The channel structure CH may be placed inside the channel hole 300. The channel structure CH may include a core pattern 410, a channel pattern 420 and an information storage film 430.

The core pattern 410 may be formed to fill the inside of the cup-shaped channel pattern 420. The core pattern 410 may include, but is not limited to, an insulating material, for example, silicon oxide.

Although the channel pattern 420 is shown as a cup shape, this is merely an example, and the channel pattern 420 may have various shapes, such as a cylindrical shape, a square-cylindrical shape, and a solid filler shape. The channel pattern 420 may include or be formed of, but is not limited to, a semiconductor material such as, for example, single crystal silicon, polycrystalline silicon, an organic semiconductor matter or a carbon nanostructure. The channel pattern 420 may correspond to one of the channel regions 30 of FIGS. 1 to 12.

The information storage film 430 may be interposed between the channel pattern 420 and the word lines. For example, the information storage film 430 may extend along the side surfaces of the channel pattern 420.

In some example embodiments, the information storage film 430 may be formed of multi films. For example, the information storage film 430 may include a second tunnel insulating layer 431, a second charge storage layer 432, and a second barrier insulating layer 433 that are sequentially stacked on the channel pattern 420. For example, the channel structure CH may include the second barrier insulating layer 433, the second charge storage layer 432, the second tunnel insulating layer 431, the channel pattern 420, and the core pattern 410 that are sequentially formed along the profile of the channel hole 300. The second tunnel insulating layer 431, the second charge storage layer 432, and the second barrier insulating layer 433 may correspond to the respective first tunnel insulating layer 40, the first charge storage layer 50, and the first barrier insulating layer 60 of FIGS. 1 to 12.

The channel pattern 420 may be placed on the second tunnel insulating layer 431. The channel pattern 420 may be in contact with the second tunnel insulating layer 431.

The second tunnel insulating layer 431 may be placed on the second charge storage layer 432. The second tunnel insulating layer 431 may be in contact with the second charge storage layer 432. The second tunnel insulating layer 431 may include or be formed of, for example, a silicon oxide or a high dielectric constant material (e.g., aluminum oxide ($Al_2O_3$) or hafnium oxide ($HfO_2$)) having a higher dielectric constant than silicon oxide.

The second charge storage layer 432 may be a charge trap type membrane or a floating gate. A method of trapping the charge is merely an example, and the technical idea of the present disclosure is not limited thereto.

The second charge storage layer 432 may be placed on the second barrier insulating layer 433. The second charge storage layer 432 may be in contact with the second barrier insulating layer 433. The second charge storage layer 432 may include or be formed of a ferroelectric material.

Although the second charge storage layer 432 may include or be formed of at least one of InSe and BaTiO$_3$, this is merely an example, and the technical idea of the present disclosure is not limited thereto. The second charge storage layer 432 may include or be formed of, for example, silicon nitride.

The second barrier insulating layer 433 may be in contact with the gate layer CL. The second barrier insulating layer 433 may include or be formed of, for example, a silicon oxide or a high dielectric constant material having a higher dielectric constant than silicon oxide.

The semiconductor memory device according to some example embodiments may include a third region A3 and a fourth region A4. The second charge storage layer 432 may be placed on the third region A3, and may not be placed on the fourth region A4. The second tunnel insulating layer 431 and the second barrier insulating layer 433 may be placed on the third region A3 and the fourth region A4.

The second tunnel insulating layer 431 may extend in one direction. The second tunnel insulating layer 431 may extend along a part of the inner wall of the second charge storage layer 432 and the inner wall of the second barrier insulating layer 433.

On the third region A3, the second tunnel insulating layer 431 may extend along the inner wall of the second charge storage layer 432. On the third region A3, the second tunnel insulating layer 431 may be in contact with the inner wall of the second charge storage layer 432.

On the fourth region A4, the second tunnel insulating layer 431 may extend along the inner wall of the second barrier insulating layer 433. On the fourth region A4, the second tunnel insulating layer 431 may be in contact with the inner wall of the second barrier insulating layer 433.

The second barrier insulating layer 433 may extend along the outer wall, the upper surface and the lower surface of the second charge storage layer 432.

Specifically, on the third region A3, the second barrier insulating layer 433 may extend along the outer wall of the second charge storage layer 432. On the third region A3, the second barrier insulating layer 433 may be in contact with the outer wall of the second charge storage layer 432.

On the fourth region A4, the second barrier insulating layer 433 may extend along the upper and lower surfaces of the second charge storage layer 432 and the outer wall of the second tunnel insulating layer 431. The second barrier insulating layer 433 may be in contact with the upper and lower surfaces of the second charge storage layer 432 and the outer wall of the second tunnel insulating layer 431.

Figure 15:
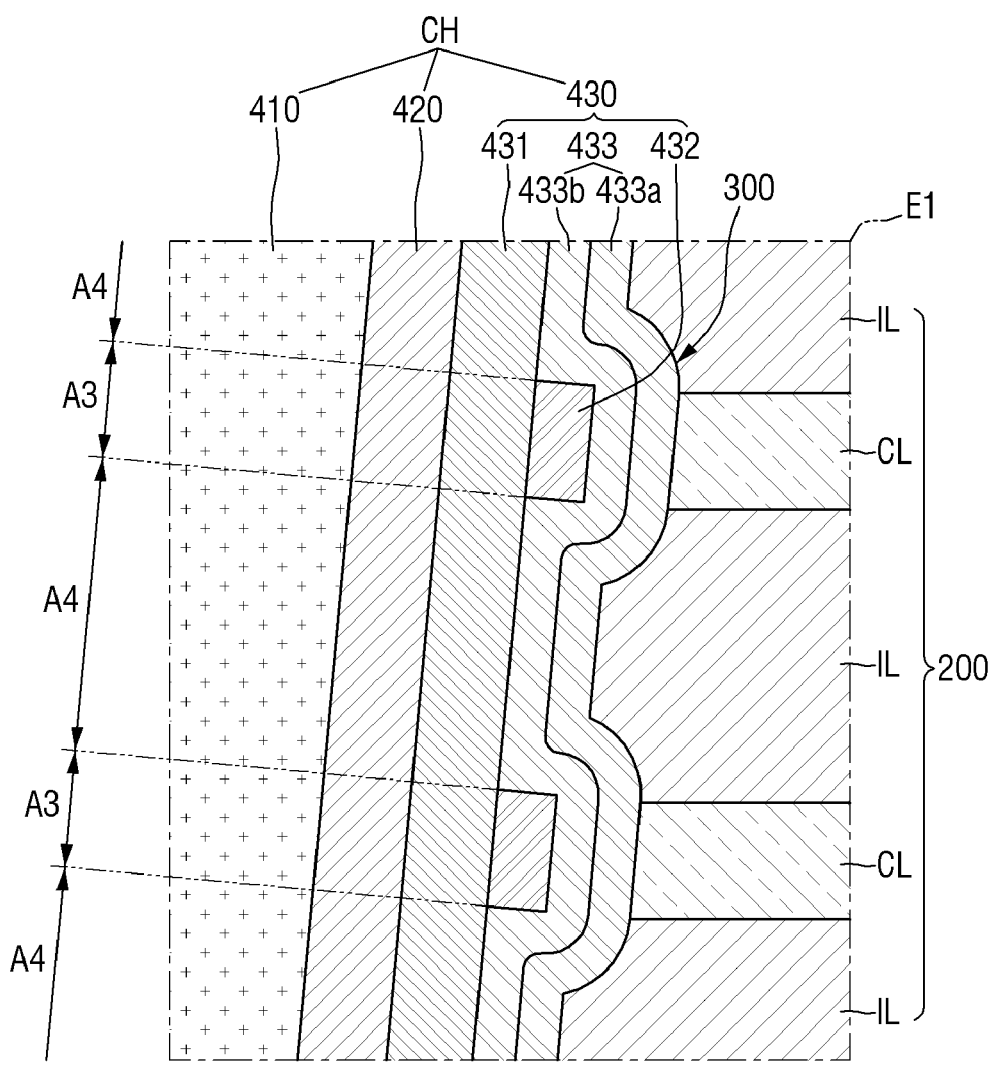
FIGS. 15 to 17 are diagrams for explaining a semiconductor memory device according to some example embodiments, respectively.
Figure 16:
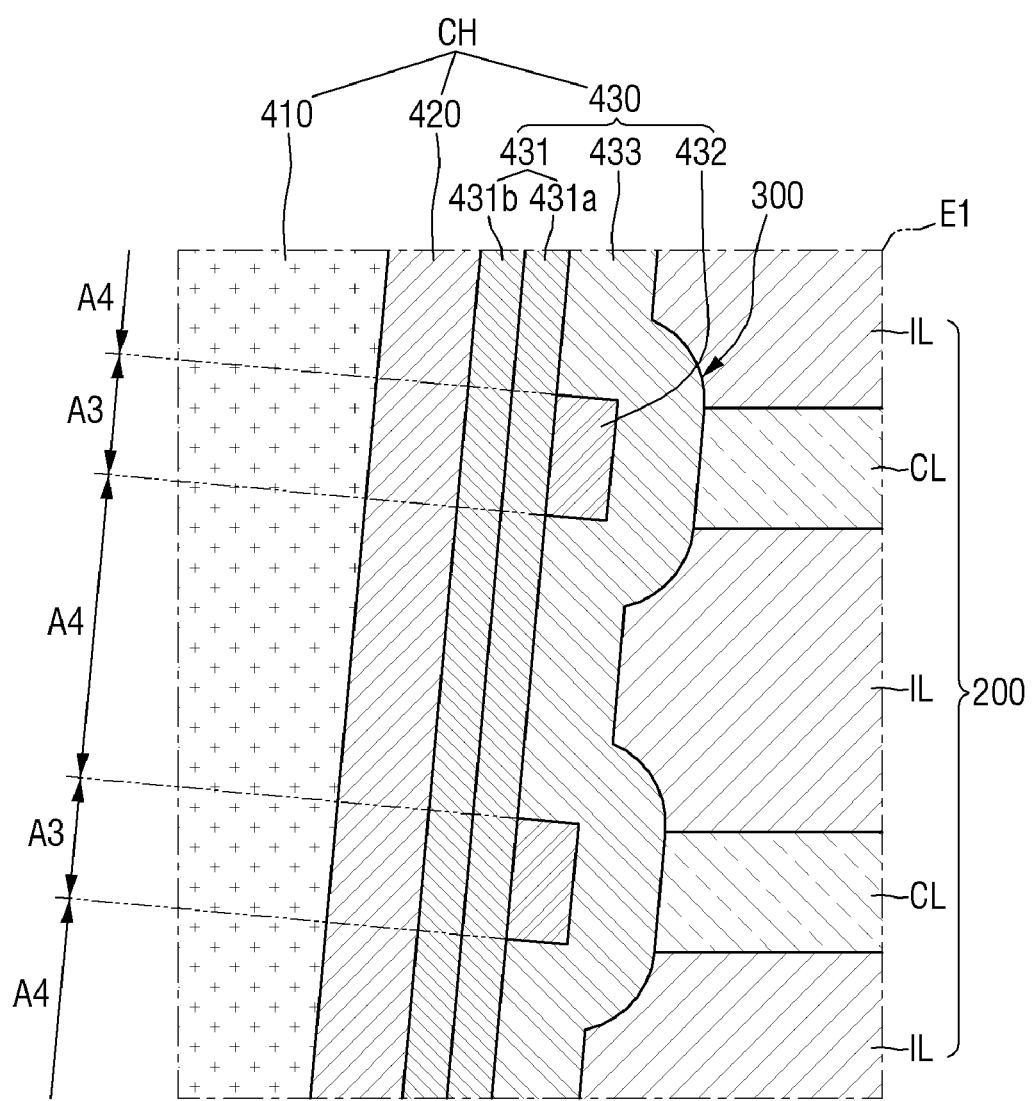
Figure 17:
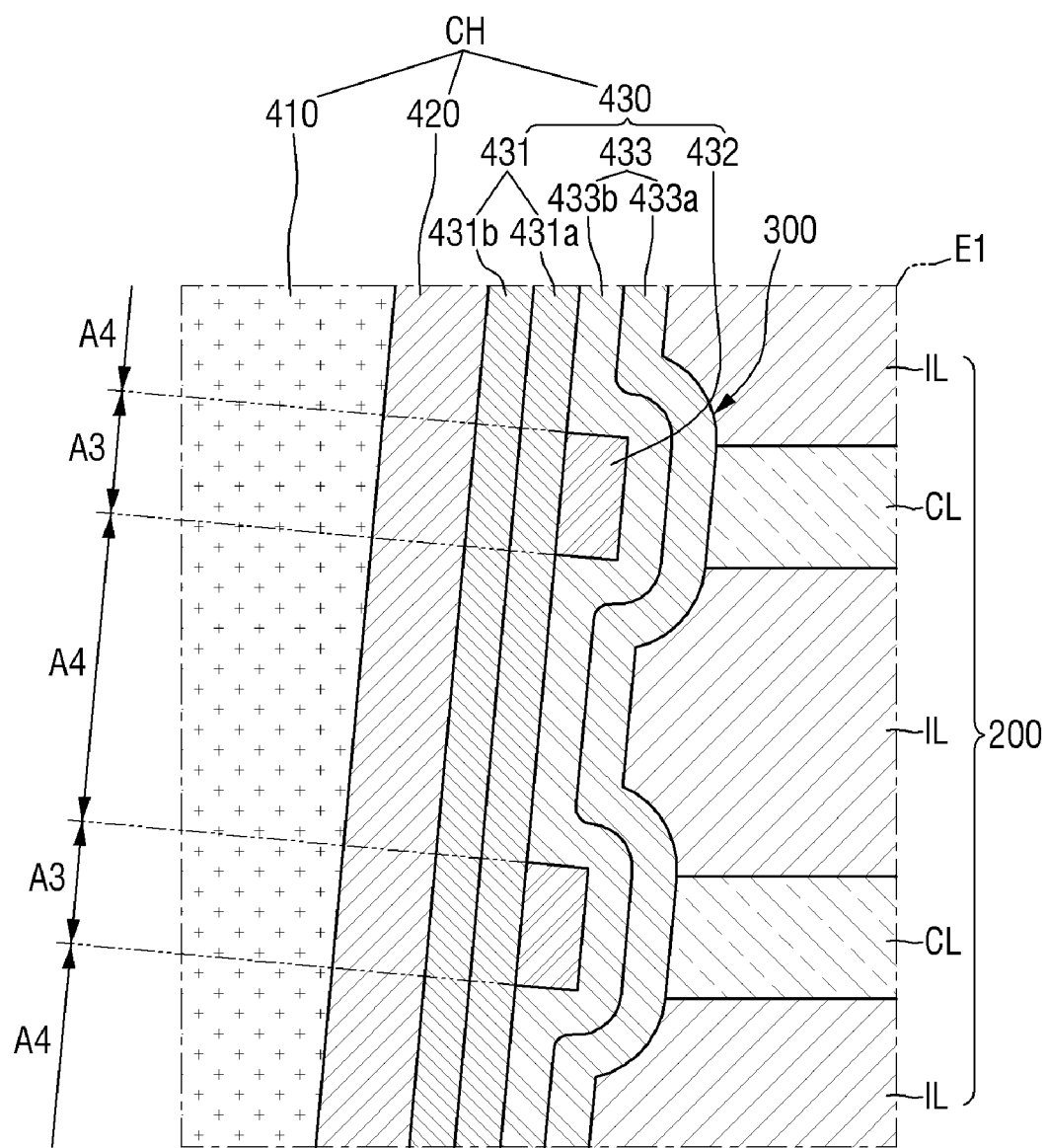

FIGS. 15 to 17 are diagrams for explaining a semiconductor memory device according to some example embodiments, respectively. Differences from those described using FIG. 14 will be mainly described.

Referring to FIG. 15, in the semiconductor memory device according to some example embodiments, the second barrier insulating layer 433 may be made of a composite film. Specifically, the second barrier insulating layer 433 may include a second_first barrier insulating layer 433*a* and a second_second barrier insulating layer 433*b*. The second_first barrier insulating layer 433*a* and the second_second barrier insulating layer 433*b* may be sequentially formed along the profile of the channel hole 300.

The second_first barrier insulating layer 433*a* may extend along the outer wall of the second_second barrier insulating layer 433*b*. The second_first barrier insulating layer 433*a* may be placed between the second_second barrier insulating layer 433*b* and the stacked structure 200. The second_first barrier insulating layer 433*a* may be in contact with the second_second barrier insulating layer 433*b* and the stacked structure 200.

The second_second barrier insulating layer 433*b* may extend along the outer wall of the second charge storage layer 432. The second_second barrier insulating layer 433*b* may be in contact with the second charge storage layer 432.

Referring to FIG. 16, in the semiconductor memory device according to some example embodiments, the second tunnel insulating layer 431 may be made of a composite film. Specifically, the second tunnel insulating layer 431 may include a second_first tunnel insulating layer 431*a* and a second_second tunnel insulating layer 431*b*. The second_first tunnel insulating layer 431*a* and the second_second tunnel insulating layer 431*b* may be sequentially formed along the profile of the channel hole 300.

The second_first tunnel insulating layer 431*a* may extend along the inner wall of the second charge storage layer 432. The second_first tunnel insulating layer 431*a* may be in contact with the second charge storage layer 432.

The second_second tunnel insulating layer 431*b* may extend along the inner wall of the second_first tunnel insulating layer 431*a*. The second_second tunnel insulating layer 431*b* may be placed between the second_first tunnel insulating layer 431*a* and the channel pattern 420. The second_second tunnel insulating layer 431*b* may be in contact with the second_first tunnel insulating layer 431*a* and the channel pattern 420.

Referring to FIG. 17, in the semiconductor memory device according to some example embodiments, each of the second barrier insulating layer 433 and the second tunnel insulating layer 431 may be made of a composite film. Specifically, the second barrier insulating layer 433 may include the second_first barrier insulating layer 433*a* and the second_second barrier insulating layer 433*b*, and the second tunnel insulating layer 431 may include the second_first tunnel insulating layer 431*a* and the second_second tunnel insulating layer 431*b*.

As shown in FIG. 17, the placement of the second barrier insulating layer 433 and the second tunnel insulating layer 431 may be the same as the placement of the second barrier insulating layer 433 and the second tunnel insulating layer 431 each described in FIGS. 15 and 16.

FIGS. 18 to 21 are a diagram for explaining operation methods of a semiconductor memory device according to some example embodiments.

Figure 18:
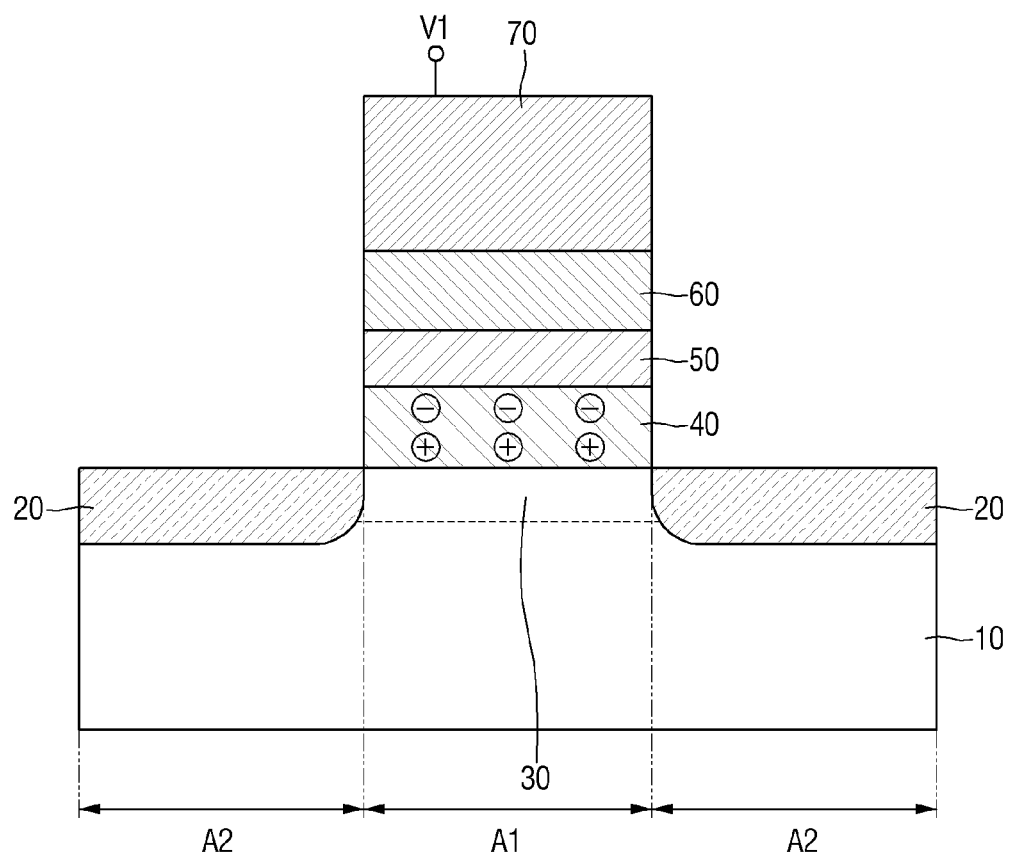
FIGS. 18 to 21 are diagrams for explaining operations of a semiconductor memory device according to some example embodiments.

Referring to FIG. 18, when the semiconductor memory device performs a first erase operation, the charge layer 50 may be polarized as a first state of polarization by applying a first voltage V1 to the gate electrode 70. For example, a voltage level of the first voltage V1 has a first positive value. The first erase operation may be performed using a ferroelectric characteristic of the charge storage layer 50. As illustrated in FIG. 18, when a positive voltage V1 is applied to the gate electrode 70, negative charges may be concentrated in the channel region 30. Therefore, a current may easily flow between source/drain regions 20, and a threshold voltage of a memory cell may be reduced.

Figure 19:
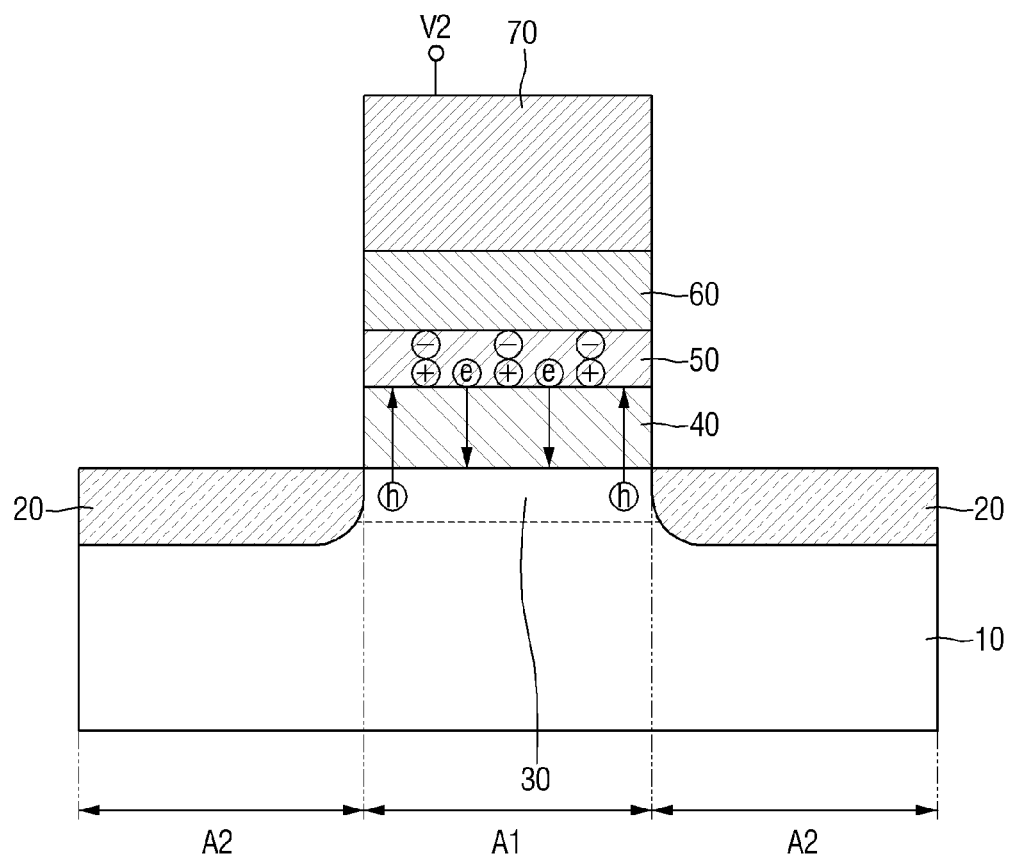

Referring to FIG. 19, when the semiconductor memory device performs a second erase operation, the charge layer 50 may be polarized as a second state of polarization opposite to the first state and injected positive charges (e.g., holes) by applying a second voltage V2 to the gate electrode 70. For example, a voltage level of the second voltage V2 has a first negative value. The second erase operation may be performed using the charge storage layer 50 as a charge injection layer like a floating gate or a charge trapping layer of a flash memory. As illustrated in FIG. 19, when a negative voltage V2 is applied to the gate electrode 70, more negative charges may be concentrated in the channel region 30. Therefore, a high current may flow between source/drain regions 20, and a threshold voltage of the memory cell may be more reduced.

Figure 20:
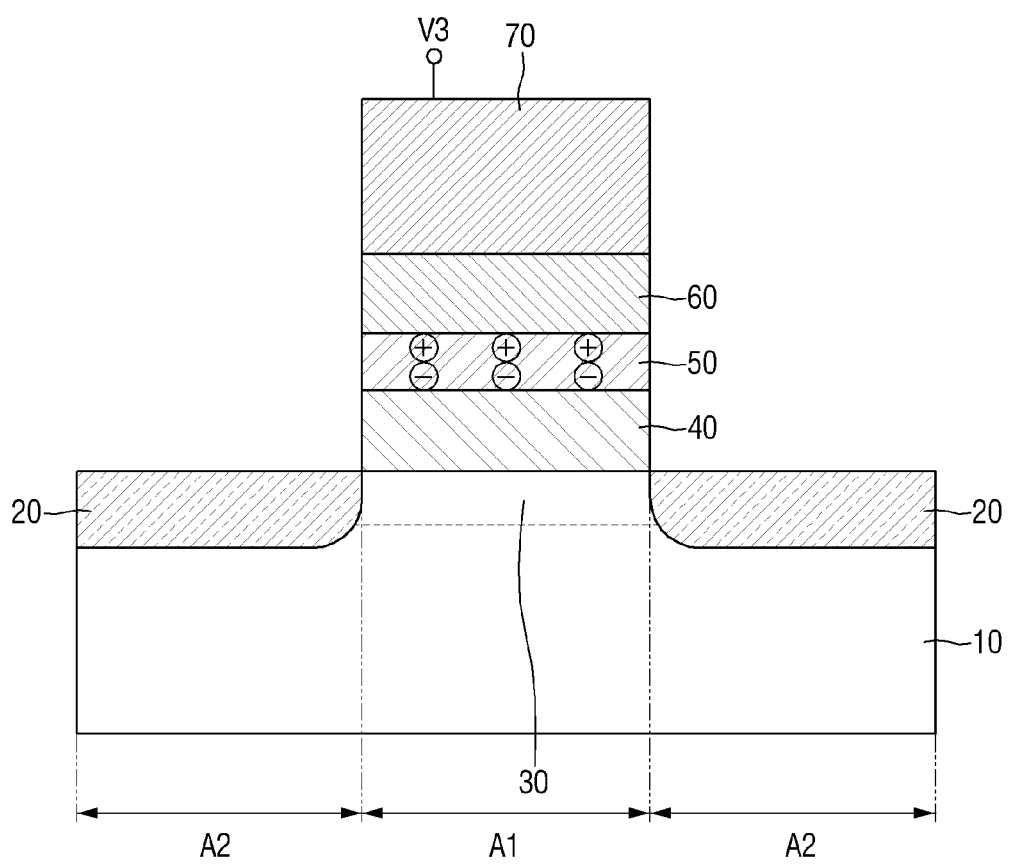

Referring to FIG. 20, when the semiconductor memory device performs a first program operation, the charge layer 50 may be polarized as the second state of polarization by applying a third voltage V3 to the gate electrode 70. For example, a voltage level of the third voltage V3 may have a second negative value less negative than the first negative value. The first program operation may be performed using a ferroelectric characteristic of the charge storage layer 50. As illustrated in FIG. 20, when a negative voltage V3 is applied to the gate electrode 70, positive charges may be concentrated in the channel region 30. Therefore, a current may not easily flow between source/drain regions 20, and a threshold voltage of the memory cell may be increased.

Figure 21:
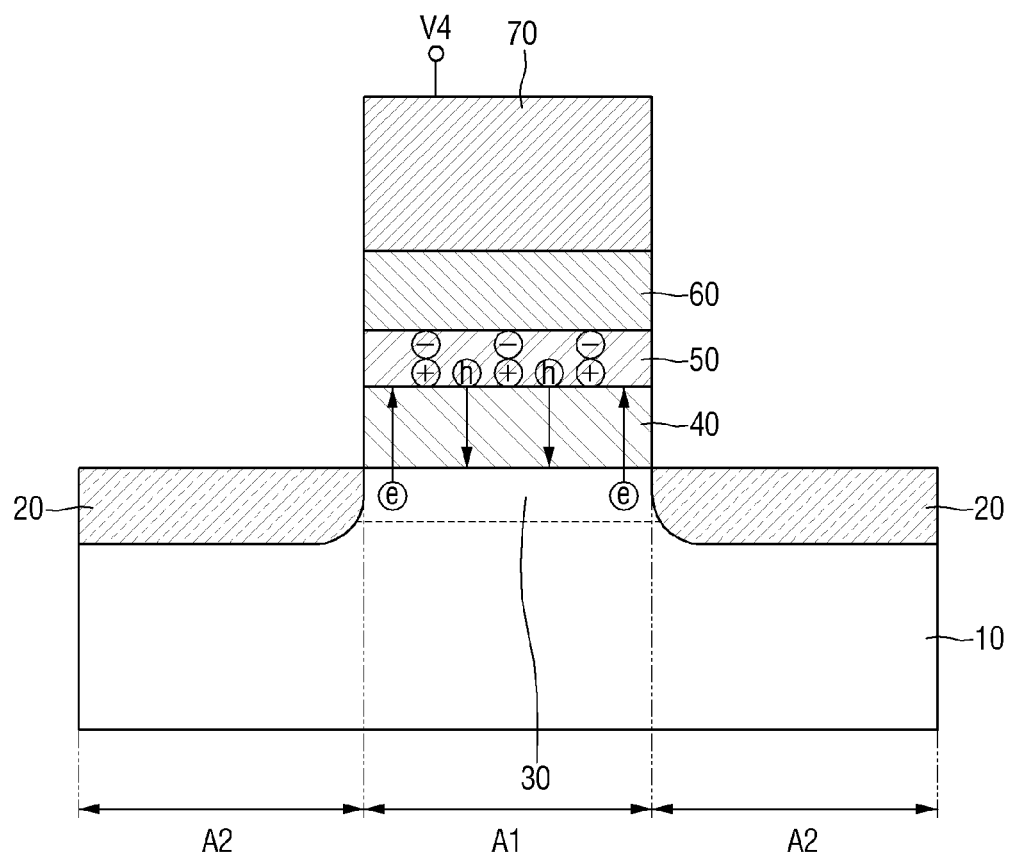

Referring to FIG. 21, when the semiconductor memory device performs a second program operation, the charge layer 50 may be polarized as the first state of polarization and injected negative charges (e.g., electrons) by applying a fourth voltage V4 to the gate electrode 70. For example, a voltage level of the fourth voltage V4 may have a second positive value greater than the first positive value. The second program operation may be performed using the charge storage layer 50 as a charge injection layer like a floating gate or a charge trapping layer of a flash memory. As illustrated in FIG. 21, when a positive voltage V4 is applied to the gate electrode 70, more positive charges may be concentrated in the channel region 30. Therefore, a current may not flow between source/drain regions 20, and a threshold voltage of the memory cell may be more increased.

In some example embodiments, the semiconductor memory device including the charge layer 50 having a ferroelectric material may operate for a high speed using a ferroelectric characteristic of the charge layer 50, and may operate for a long retention data using the charge storage layer 50 like a charge injection layer of a flash memory. Thus, the semiconductor memory device according to example embodiments may perform the first erase/program operations at a low voltage like a FRAM and the second erase/program operations like a flash memory.

In concluding the detailed description, those skilled in the art will appreciate that many variations and modifications may be made to the preferred embodiments without substantially departing from the principles of the present inventive concept. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor memory device comprising:
    a substrate including second parts and a first part between the second parts;
    a tunnel insulating layer including second parts and a first part between the second parts of the tunnel insulating layer, and contacting the first part of the substrate;
    a charge storage layer contacting the first part of the tunnel insulating layer and including a ferroelectric material;
    a barrier insulating layer filling space between two adjacent charge storage layers and contacting the second parts of the tunnel insulating layer and the charge storage layer; and
    a gate electrode contacting the barrier insulating layer,
    wherein the tunnel insulating layer, the charge storage layer, the barrier insulating layer, and the gate electrode are sequentially stacked on the substrate.

2. The semiconductor memory device of claim 1, wherein the barrier insulating layer extends along an upper surface and side surfaces of the charge storage layer, and
    wherein the tunnel insulating layer extends along a part of a lower surface of the barrier insulating layer and a lower surface of the charge storage layer.

3. The semiconductor memory device of claim 2, wherein the barrier insulating layer includes:
    a first barrier insulating layer extending along an upper surface of the charge storage layer, and contacting the charge storage layer; and
    a second barrier insulating layer extending along an upper surface of the first barrier insulating layer, and contacting the first barrier insulating layer and the gate electrode, and
    wherein a material of the first barrier insulating layer is different from a material of the second barrier insulating layer.

4. The semiconductor memory device of claim 2, wherein the tunnel insulating layer includes:
    a first tunnel insulating layer extending along a lower surface of the charge storage layer, and contacting the charge storage layer; and
    a second tunnel insulating layer extending along a lower surface of the first tunnel insulating layer, and contacting the first tunnel insulating layer, and
    wherein a material of the first tunnel insulating layer is different from a material of the second tunnel insulating layer.

5. The semiconductor memory device of claim 1, wherein the barrier insulating layer extends along an upper surface of the charge storage layer, and is not formed along side surfaces of the charge storage layer, and
    wherein the tunnel insulating layer extends along a lower surface of the charge storage layer, and is not in contact with the barrier insulating layer.

6. The semiconductor memory device of claim 1, wherein the barrier insulating layer includes:
    a first barrier insulating layer extending along an upper surface of the charge storage layer, and contacting the charge storage layer; and
    a second barrier insulating layer extending along an upper surface of the first barrier insulating layer, and contacting the first barrier insulating layer and the gate electrode, and
    wherein a material of the first barrier insulating layer is different from a material of the second barrier insulating layer.

7. The semiconductor memory device of claim 6, wherein the tunnel insulating layer includes:
    a first tunnel insulating layer extending along a lower surface of the charge storage layer, and contacting the charge storage layer and a part of a lower surface of the first barrier insulating layer; and
    a second tunnel insulating layer extending along a lower surface of the first tunnel insulating layer, and contacting the first tunnel insulating layer, and wherein a material of the first tunnel insulating layer is different from a material of the second tunnel insulating layer.

8. The semiconductor memory device of claim 1, wherein the tunnel insulating layer includes:
 a first tunnel insulating layer extending along a lower surface of the charge storage layer, and contacting the charge storage layer; and
 a second tunnel insulating layer extending along a lower surface of the first tunnel insulating layer, and contacting the first tunnel insulating layer, and
 wherein a material of the first tunnel insulating layer is different from a material of the second tunnel insulating layer.

9. The semiconductor memory device of claim 1, wherein the barrier insulating layer extends along an upper surface and side surfaces of the charge storage layer and side surfaces of the tunnel insulating layer.

10. The semiconductor memory device of claim 9, wherein the barrier insulating layer includes a metal oxide.

* * * * *